though the resolution is dependent on the wavelength of light, the thickness of a resist film and the like, it is difficult to attain the resolution of 20 μm or less.
United States Patent [19]
Tachiki et al.

[11] Patent Number: 5,230,984
[45] Date of Patent: Jul. 27, 1993

[54] POSITIVE TYPE PHOTOSENSITIVE ANIONIC ELECTRODEPOSITION COATING RESIN COMPOSITION

[75] Inventors: Shigeo Tachiki; Masahiko Hiro; Toshihiko Akahori; Takuro Kato, all of Hitachi, Japan

[73] Assignee: Hitachi Chemical Company, Ltd., Tokyo, Japan

[21] Appl. No.: 799,971

[22] Filed: Nov. 29, 1991

[30] Foreign Application Priority Data

Nov. 30, 1990 [JP] Japan .................................. 2-329471
Feb. 26, 1991 [JP] Japan .................................. 3-030549
May 31, 1991 [JP] Japan .................................. 3-129624

[51] Int. Cl.⁵ .............................................. G03C 1/492
[52] U.S. Cl. ...................................... 430/270; 430/326; 430/327; 430/910; 430/919; 430/921; 430/935; 522/57; 522/59; 522/86; 522/153; 204/180.6; 204/181.6
[58] Field of Search ............... 430/270, 271, 326, 327, 430/910, 919, 921, 935; 522/57, 86, 59, 153; 204/180.6, 181.6

[56] References Cited

U.S. PATENT DOCUMENTS 5,045,431  9/1991  Allen et al. ......................... 430/910
5,071,730 12/1991  Allen et al. ......................... 430/910
5,120,629  6/1992  Bauer et al. ........................ 430/270

FOREIGN PATENT DOCUMENTS 0307918  3/1989  European Pat. Off. .
0330059  8/1989  European Pat. Off. .
0335330 10/1989  European Pat. Off. .

Primary Examiner—Marion E. McCamish
Assistant Examiner—Janis L. Dote
Attorney, Agent, or Firm—Antonelli, Terry, Stout & Kraus

[57] ABSTRACT

A resin composition comprising (A) a copolymer obtained by copolymerizing (a) acrylic acid and/or methacrylic acid, (b) at least one compound having an unstable group against an acid such as t-amyl acrylate, t-amyl methacrylate, etc. and (c) a copolymerizable monomer such as n-butyl acrylate and (B) a photoacid generator is effective for providing an electro-deposition bath good in water dispersion stability and an electrodeposited film having high sensitivity and high resolution.

12 Claims, No Drawings

POSITIVE TYPE PHOTOSENSITIVE ANIONIC ELECTRODEPOSITION COATING RESIN COMPOSITION

BACKGROUND OF THE INVENTION

This invention related to a positive type photosensitive anionic electrodeposition coating resin composition, an electrodeposition bath using the same, an electrodeposition process and a process for producing printed circuit boards.

As processes for forming resist patterns on surfaces of substrates, there has frequently been used a process comprising forming a photosensitive layer on a substrate surface, irradiating the photosensitive layer with actinic light, followed by development. As to formation of photosensitive layer, there have been known, for example, dip coating, roll coating, curtain coating, etc., using a photosensitive resin composition solution (a coating fluid), and a laminating process wherein a photosensitive film which is obtained by forming a photosensitive layer on a substrate film previously is laminated on a substrate surface using a laminator, etc. Among these processes, the laminating process using the photosensitive film are mainly employed particularly in the field of printed circuit board production due to formation of the photosensitive layer with a uniform thickness easily.

With recent progress of higher density and higher precision of printed circuit boards, resist patterns having higher quality are required now. That is, there are required resist patterns having no pin holes and good in adhesion to an underlying substrate surface. In order to meet such a requirement, the laminating process using the photosensitive film and now employed mainly is to be known having a limit. According to the laminating process, conformability to unevenness of substrate surface caused by scars at the time of substrate production, ununiformity of polishing, meshes of glass cloth present in an inner layer of substrate, ununiformity of pits and the like of copper plating on the surface, is poor, resulting in difficulty in obtaining sufficient adhesiveness. Such difficulty can be removed to some extent by carrying out the lamination of photosensitive film under reduced pressure (Japanese Patent Examined Publication No. 59-3740), but a special and expensive apparatus is necessary for such a purpose.

Under such circumstances, solution coating processes such as dip coating, roll coating, curtain coatings, etc. have been noticed again recently. But these processes have problems in that control of film thickness is difficult, uniformity of film thickness is insufficient, pin holes are generated, and the like.

Recently, there is proposed a new process for forming a photosensitive film by electrodeposition (Japanese Patent Unexamined Publication No. 62-235496). According to this process, there are advantages in that (1) adhesiveness of a resist to a substrate is improved, (2) conformability to unevenness of substrate surface is good, (3) a photosensitive film with a uniform film thickness can be formed in a short time, (4) since the coating fluid is an aqueous solution, pollution of working circumstances can be prevented, and there is no problem in prevention of disasters. Thus, there are made some proposals as to positive type photosensitive electrodeposition which seems to be effective for producing printed circuit boards having through-holes. In most cases, a quinonediazido group as a photosensitive group is used, but there are problems in that photosensitivity is low and water disposition stability of photosensitive materials is poor.

On the other hand, as a pattern forming process for producing electronic parts such as semiconductor elements, magnetic bubble memories, integrated circuits, etc., there are proposed processes using many chemical amplified system positive type photosensitive materials comprising a compound which can generate an acid upon irradiation with actinic light, and a compound which is decomposed by the acid generated and shows a property of enhancing solubility in a developing solution. These processes can be expected to show extremely higher sensitivity than the process of using the quinonediazido group. But such materials have not practically been used for electrodeposition. This is because known chemical amplified positive type photosensitive materials are dissolved in organic solvents and used for forming photosensitive films by a coating method, so that these materials cannot be dispersed in water as they are and thus cannot be used as an electrodeposition coating resin composition. In order to use these materials for electrodeposition, it is necessary to fundamentally reconstitute chemical amplified positive type photosensitive materials.

SUMMARY OF THE INVENTION

It is objects of the present invention to provide a positive type photosensitive electrodeposition coating resin composition with high sensitivity, and high resolution, an electrodeposition bath good in stability (water dispersion stability of photosensitive material), a process for electrodeposition using the said resin composition, and a process for producing a printed circuit board using said resin composition.

The present invention provides a positive type photosensitive anionic electrodeposition coating resin composition comprising (A) a copolymer obtained by copolymerizing as essential components (a) at least one member selected from the group consisting of acrylic acid and methacrylic acid, (b) at least one compound having an unstable group against an acid, for example, t-butyl methacrylate, t-butyl acrylate, t-amyl methacrylate, t-amyl acrylate, isobornyl methacrylate and isobornyl acrylate, and (c) a polymerizable monomer capable of forming a homopolymer having a glass transition temperature of 0° C. or lower, and (B) a compound cable of generating an acid when exposed to actinic light.

The present invention also provides an electrodeposition bath using the above-mentioned resin composition.

The present invention further provides a process for electrodeposition comprising dipping a substrate at least a surface of which has electro-conductivity in the above-mentioned electrodeposition both, and applying a direct current while making the substrate as an anode to form an electrodeposited film.

The present invention still further provides a process for producing a printed circuit board characterized by subjecting the resulting electrodeposited film obtained as mentioned above to exposure to light and development.

DESCRIPTION OF THE PREFERRED EMBODIMENTS

The copolymer (A) is obtained by copolymerizing (a) at least one member selected from the group consisting of acrylic acid and methacrylic acid, (b) at least one compound having an unstable group against an acid, e.g., t-butyl methacrylate, t-buthyl acrylate, t-amyl methacrylate, t-amyl acrylate, isobornyl methacrylate and isobornyl acrylate, and (c) a polymerizable monomer capable of forming a homopolymer having a glass transition temperature of 0° C. or higher.

As the monomer component (a), there are used acrylic acid and/or methacrylic acid. It is preferable to use the component (a) so as to make the acid number of the resulting copolymer (A) preferably 20 to 230, more preferably 40 to 150. When the acid number is less than 20, there is a tendency to lower water dispersibility and water dispersion stability of the positive type photosensitive anionic electrodeposition coating resin composition of the present invention after an addition of a base, followed by addition of water as explained later, and to precipitate the composition. On the other hand, when the acid number is more than 230, there is a tendency to lower surface appearance of the photosensitive film after electrodeposition. Acrylic acid and methacrylic acid can be used alone or as a mixture thereof.

Using amount of the component (a) is preferably 2 to 35 parts by weight, more preferably 5 to 23 parts by weight, per 100 parts by weight of the total amounts of monomers constituting the copolymer (A). When the amount is less than 2 parts by weight, there is a tendency to lessen dispersibility of the coating composition and to lower stability and electrodeposition properties. On the other hand, when the amount is more than 35 parts by weight, there is a tendency to lower uniformity of resulting coated film and resistance to developer.

As the component (b), there is used at least one compound having an unstable group against an acid, for example, t-butyl methacrylate, t-butyl acrylate, t-amyl methacrylate, t-amyl acrylate, isobornyl methacrylate, isobornyl acrylate, etc.

More concretely, t-butyl methacrylate and t-butyl acrylate can be used alone or as a mixture thereof.

It is also possible to use t-amyl methacrylate and t-amyl acrylate alone or as a mixture thereof.

It is further possible to use isobornyl methacrylate of the formula:

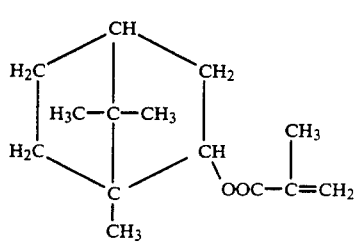

and isobornyl acrylate of the formula:

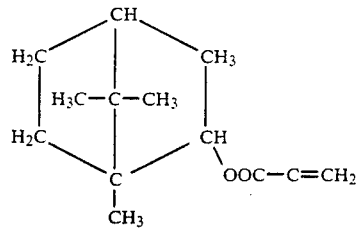

alone or as a mixture thereof.

Among these components (b), from the viewpoint of water dispersion stability, the use of tert-amyl (meth)acrylate and isobornyl (meth)acrylate is preferable, the use of tert-amyl (meth)acrylate is more preferable, and the use of tert-amyl methacrylate is particularly preferable.

Using amount of the component (b) is preferably 10 to 80 parts by weight, more preferably 20 to 60 parts by weight, per 100 parts by weight of the total amounts of monomers consitituting the copolymer (A). When the amount is less than 10 parts by weight, there is a tendency to lower photosensitivity. On the other hand, when the amount is more than 80 parts by weight, there is a tendency to lower electrodeposition properties due to too high glass transition temperature of the copolymer (A).

As the component (c), there is used a polymerizable monomer capable of forming a homopolymer having a glass transition temperature of 0° C. or lower.

The homopolymer obtained from the copolymerizable monomer (c) should have a glass transition temperature of 0° C. or lower. The glass transition temperature can be measured by a conventional thermal analysis method, preferably by a differential scanning calorimetric method (DSC).

Examples of such copolymerizable monomers are ethyl acrylate, isopropyl acrylate, n-propyl acrylate, isobutyl acrylate, 2-ethylhexyl acrylate, n-hexyl methacrylate, n-octyl methacrylate, n-decyl methacrylate, etc. Among these monomers, n-butyl acrylate and 2-ethylhexyl acrylate are preferable. These monomers can be used alone or as a mixture thereof.

Using amount of the component (c) is preferably 5 to 75 parts by weight, more preferably 20 to 60 parts by weight, per 100 parts by weight of the total amounts of monomers constituting the copolymer (A). When the amount is less than 5 parts by weight, the glass transition temperature of the homopolymer becomes too high, resulting in showing a tendency to lower electrodeposition properties. On the other hand, when the amount is more than 75 parts by weight, the glass transition temperature of the copolymer (A) becomes too low, resulting in showing a tendency to increase sticking (or tackiness) of coated film after electrodeposition.

Particularly preferable amounts of the monomers (a), (b) and (c) constituting the copolymer (A) are 5 to 23 parts by weight of the component (a), 20 to 60 parts by weight of the component (b), and 20 to 60 parts by weight of the component (c), per 100 parts by weight of the total of the components (a), (b) and (c).

The copolymer (A) may further contain one or more monomers other than the polymerizable monomers (a), (b) and (c) mentioned above. Examples of such monomers are methyl acrylate, methyl methacrylate, ethyl methacrylate, n-butyl methacrylate, cyclohexyl methacrylate, norbornyl methacrylate, norbornenyl methacrylate, mesityl methacrylate, phenetyl methacrylate, adamantyl methacrylate, tricyclo[5.2.1.0$^{2,6}$]deca-8-(or 9)-yl methacrylate, dicyclopentenyloxyethyl methacrylate, dicyclopentenyl methacrylate, tetrahydrofurfuryl methacrylate, 2,2,2-trifluoroethyl methacrylate, diacetoneacrylamide, acrylonitrile, styrene, vinyltoluene, etc. These monomers can be used alone or as a mixture thereof. These monomers can be used in amounts of preferably 50 parts by weight or less, more preferably 30 parts by weight or less, per 100 parts by weight of the total of copolymerizable monomers (a), (b) and (c).

The copolymer (A) can generally be obtained by solution polymerization of the polymerizable monomers in an organic solvent using a polymerization initiator such as azobisisobutyronitrile, azobisdimethylvaleronitrile, benzoyl peroxide, or the like. As the organic solvent, the use of hydrophilic organic solvent such as dioxane, methoxyethanol, ethoxyethanol, diethylene glycol, or the like is preferable considering that such an organic solvent is also used for electrodeposition. When a hydrophobic organic solvent such as toluene, xylene, benzene, etc. is mainly used, such a solvent should be removed by distillation after copolymerization and a hydrophilic organic solvent should be substituted therefor.

The copolymer (A) has a weight average molecular weight (converted to standard polystyrene) of preferably 5,000 to 150,000, more preferably 20,000 to 90,000.

When the molecular weight is less than 5,000, mechanical strength of a resist becomes weak. On the other hand, when the molecular weight is more than 150,000, there is a tendency to lower electrodeposition properties and to lower surface appearance of coated film.

The copolymer (A) has a glass transition temperature of preferably 0° to 100° C., more preferably 10° to 70° C., particularly preferably 20° to 50° C. When the glass transition temperature is too low, there is a tendency to increase sticking of coated film. On the other hand, when the glass transition temperature is too high, there is a tendency to lower electrodeposition properties.

The copolymer (A) is preferably used in an amount of 60 to 99.999 parts by weight, more preferably 80 to 99.9 parts by weight, per 100 parts by weight of the total weight of the copolymer (A) and the component (B). When the amount is less than 60 parts by weight, stability of electrodeposition bath and coated film against light and heat is lowered. On the other hand, when the amount is more than 99.999 parts by weight, there is a tendency to undesirably make the photosensitivity too low.

As the compound capable of generating an acid when exposed to actinic light (hereinafter referred to as "photoacid generator"), there can be used phosphonium salts, sulfonium salts, diazonium salts and iodonium salts, individually containing $AsF_6^3$, $ClO_4^3$, $SbF_6^3$ or $PF_6^3$ group; oxazole derivatives, e.g.,

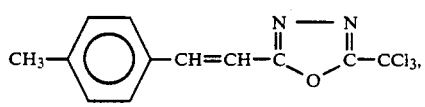

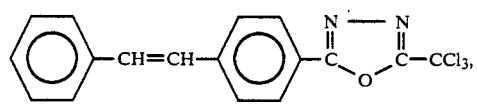

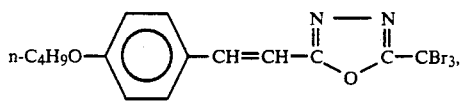

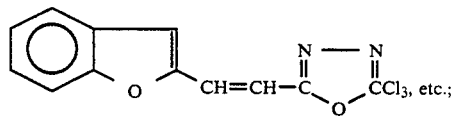

s-triazine derivatives, e.g.,

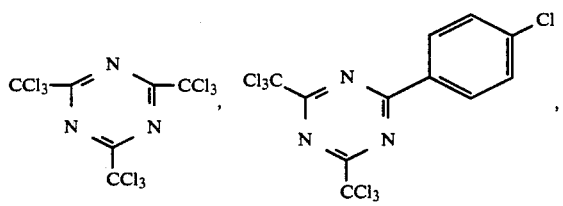

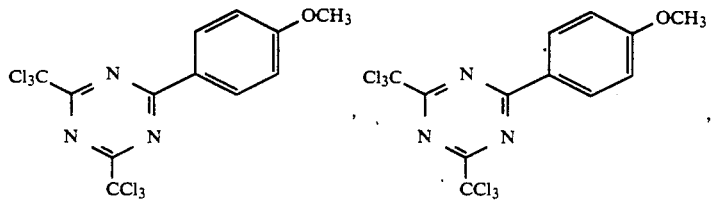

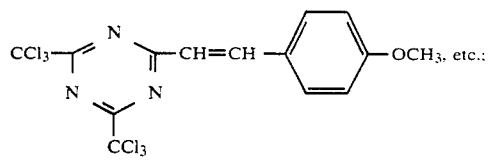
disulfone derivatives, e.g.,
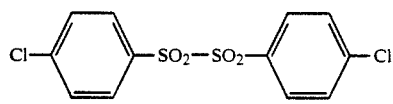
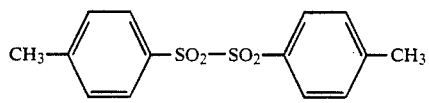
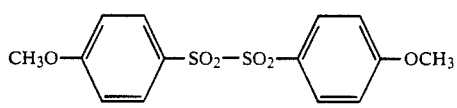
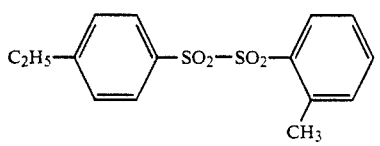
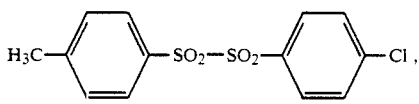
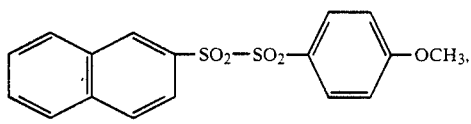
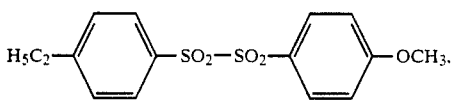
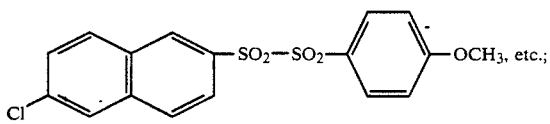
imidosulfonate derivatives, e.g.,
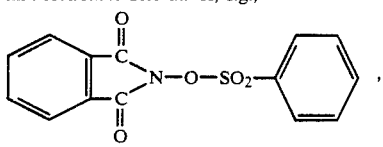
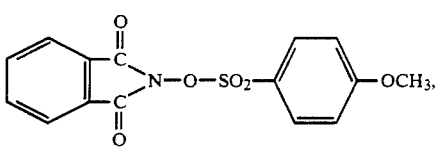

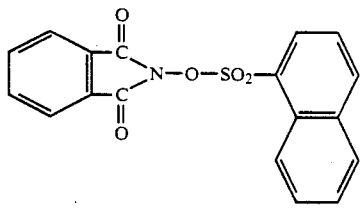

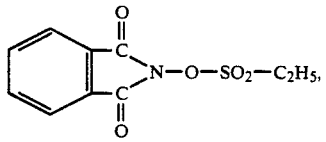

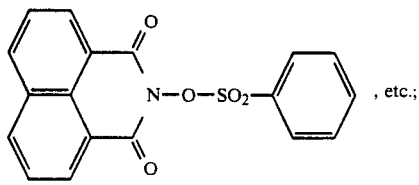

nitrobenzyl derivatives of the formula:

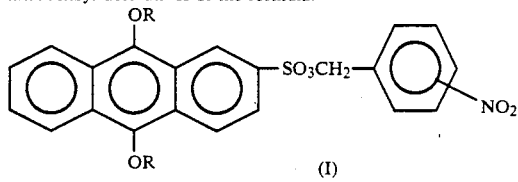

wherein R is an alkyl group preferably having 1 to 6 carbon atoms, for example,

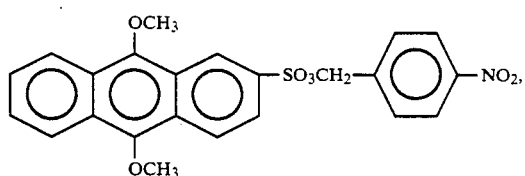

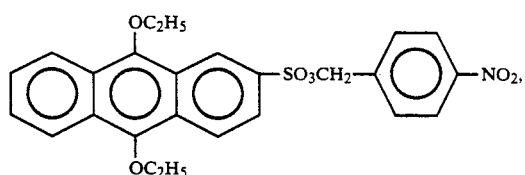

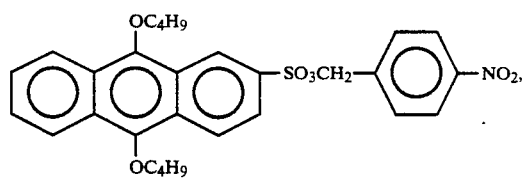

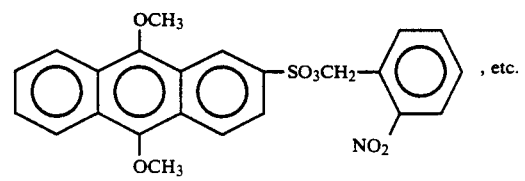

Among these compounds, the oxazole derivatives, s-triazine derivatives, disulfone derivatives, imidosulfonate derivatives and nitrobenzyl derivatives, all having no ionic bond in their molecules (having no salt structure), are preferable from the viewpoint of photosensitivity. Particularly, the nitrobenzyl derivatives are more preferable.

The photoacid generator (B) is used in an amount of preferably 0.001 to 40 parts by weight more preferably 0.1 to 20 parts by weight, per 100 parts by weight of the total weight of the components (A) and (B). When the amount is less than 0.001 part by weight, the photosensitivity becomes too low, while when the amount is more than 40 parts by weight, there is a tendency to lower the stability of water dispersibility of electrodeposition bath.

The positive type photosensitive anionic electrodeposition coating resin composition of the present invention may contain a compound (a sensitizer) which can increase an acid generation efficiency of the photoacid generator.

Examples of the sensitizer are anthracene, phenanthrene, pyrene, thioxanthone, benzophenone, anthrone, Michler's ketone, 9-fluorenone, phenothiazine, etc.

The sensitizer can be used in molar ratio of sensitizer/photoacid generator in the range of preferably 0.01/1 to 20/1, more preferably 0.1/1 to 5/1.

The positive type photosensitive anionic electrodeposition coating resin composition of the present invention may contain one or more dyes, pigments, plasticizers, adhesion accelerating agents, inorganic fillers, and the like additives.

The resin composition of the present invention containing the components (A) and (B) as major components can be made into an electrodeposition coating solution preferably by dissolving the components (A) and (B) and, if necessary, other additives mentioned above, in a hydrophilic organic solvent uniformly. As the hydrophilic organic solvent, there can be used dioxane, methoxyethanol, ethoxyethanol, diethylene glycol, etc., alone or as a mixture thereof. The organic solvent is used preferably in a amount of 300 parts by weight or less per 100 parts by weight of the total solid components.

Then, a base is added to the resulting solution to neutralize the carboxyl group containing in the copolymer (A), resulting in making solubilization in water or dispersion in water easy.

As the base, there can be used triethylamine, monoethanolamine, diethanolamine, diisopropylamine, dimethylaminoethanol, morpholine, ammonia, sodium hydroxide, etc., alone or as a mixture thereof.

The base is used in an amount of preferably 0.3 to 1.0 equivalent weight per equivalent weight of the carboxyl group in the copolymer (A). When the amount is less than 0.3 equivalent weight, there is a tendency to lower water dispersion stability in the electrodeposition bath, while when the amount is more than 1.0 equivalent weight, the thickness of coated film (photosensitive layer) after electrodeposition becomes thin and there is a tendency to undesirably lower storage stability.

Then, an electrodeposition bath is prepared by adding water to the resulting composition for dissolving or dispersing the composition in water.

The electrodeposition bath preferably has a solid content of 5 to 20% by weight and pH of 6.0 to 9.0, more preferably 7.0 to 9.0. When the pH is too low, the dispersion becomes worse so as to make electrophoresis difficult. On the other hand, when the pH is higher than 9.0, there often brings about redissolution of once electrodeposited film, resulting in failing to form the film. In order to maintain the pH in the above-mentioned preferable range, a base as mentioned above can be added in later stage for adjustment.

In order to enhance the water dispersibility or dispersion stability of the positive type photosensitive anionic electrodeposition coating resin composition, it is possible to add a surfactant such as monionic, anionic, cationic, and the like surfactant.

Further, in order to increase a coating amount at the time of electrodeposition, it is possible to add a hydrophobic solvent such as toluene, xylene, 2-ethylhexyl alcohol, etc.

Using the resulting electrodeposition bath, electrodeposition can be carried out by dipping a substrate in the electrodeposition bath and usually applying a direct current of 50 to 400 V using the substrate as an anode for 10 seconds to 5 minutes. It is preferable to control the temperature of electro-deposition bath at 15° to 30° C. The substrate should have a surface or surfaces covered with a metal such as iron, aluminum, copper, zinc, or the like, or an alloy thereof, or other electroconductive material (e.g. polypyrrole) and show electroconductivity.

After electrodeposition, a coated material is taken out of the electrodeposition bath, washed with water, drained and dried with hot air, etc. When the drying temperature is too high, there is a fear of decomposing the unstable group against an acid, e.g. the tert-butyl ester group, tert-amyl ester group, or isobornyl ester group in the positive type photosensitive anionic electrodeposition coating resin composition. Thus, it is preferable to dry at 110° C. or lower.

The thickness of thus obtained coated film (photosensitive layer) is preferably 2 to 50 μm. When the film thickness is less than 2 μm, the film is poor in resistance to developer and in the case of using the coated film in the production of printed circuit boards, there is a tendency to be poor in resistance to etching solution and in etch factor when subjected to etching treatment after forming a resist pattern. On the other hand, when the film thickness is more than 50 μm, resolution of resist pattern often lowers.

The coated film is then irradiated imagewisely with actinic light to generate an acid on the light exposed portions, and if necessary, heated at 80° to 140° C. for 1 to 20 minutes, and then developed for removing the light exposed portions to obtain a resist pattern.

As a light source of actinic light, there can be preferably used those emitting a light of 300 to 450 nm in wavelength, for example, mercury vapor arc, carbon arc, xenone arc, etc.

The development can usually be carried out by spraying an alkaline aqueous solution of, e.g. sodium hydroxide, sodium carbonate, potassium hydroxide, etc., or by dipping in such an alkaline aqueous solution.

Thus, a printed circuit board with high density and high precision can be produced by exposing to light and developing an electrodeposited film formed on a substrate.

The present invention is illustrated by way of the following Examples.

Reference Example 1

Copolymers (A-1) to (A-4) were prepared as follows.
(A-1)

In a flask equipped with a stirrer, a reflux condenser, a thermometer, a dropping funnel, and a nitrogen introducing pipe, 1130 g of dioxane was placed and heated to 90° C. with stirring while introducing a nitrogen gas thereinto. When the temperature became constant at 90° C., a mixed fluid of 100 g of methacrylic acid, 500 g of tert-butyl methacrylate, 400 g of n-butyl acrylate and 10 g of azobisisobutyronitrile was added dropwise to the flask in 3 hours, followed by stirring at 90° C. for 3 hours. Then, a solution obtained by dissolving 3 g of azobisdimethylvaleronitrile in 100 g of dioxane was added dropwise to the flask in 10 minutes, followed by stirring at 90° C. for 4 hours.

The thus obtained copolymer (A-1) had a weight average molecular weight of 45,000 and an acid number of 65.

The solid content of the copolymer solution was 45.2% by weight.
(A-2)

In the same flask as used in (A-1), 1130 g of propylene glycol monomethyl ether was placed and heated to 90° C. with stirring, while introducing a nitrogen gas thereinto. When the temperature became constant at 0° C., a mixed fluid of 77 g of methacrylic acid, 350 g of tert-butyl methacrylate, 450 g of 2-ethylhexyl acrylate, 123 g of methyl methacrylate and 7 g of azobisisobutyronitrile was added dropwise to the flask in 3 hours, followed by stirring at 90° C. for 3 hours. Then, a solution obtained by dissolving 3 g of azobisdimethylvaleronitrile in 100 g of propylene glycol monomethyl ether was added dropwise to the flask in 10 minutes, followed by stirring at 90° C. for 4 hours.

The thus obtained copolymer (A-2) had a weight average molecular weight of 53,000 and an acid number of 50.5.

The solid content of the copolymer solution was 45.1% by weight.
(A-3)

In the same flask as used in (A-1), 1130 g of propylene glycol monopropyl ether was placed and heated to 80° C. with stirring, while introducing a nitrogen gas thereinto. When the temperature became constant at 80° C., a mixed fluid of 141 g of acrylic acid, 620 g of tert-butyl methacrylate, 239 g of 2-ethylhexyl acrylate, and 10 g of azobisisobutyronitrile was added dropwise to the flask in 3 hours, followed by stirring at 80° C. for 4 hours. Then, a solution obtained by dissolving 3 g of azobisdimethylvaleronitrile in 100 g of propylene glycol monopropyl ether was added dropwise to the flask in 10 minutes, followed by stirring at 80° C. for 6 hours.

The thus obtained copolymer (A-3) had a weight average molecular weight of 63,000 and an acid number of 110.5.

The solid content of the copolymer solution was 45.3% by weight.

(A-4)

In the same flask as used in (A-1), 1130 g of propylene glycol monopropyl ether was placed and heated to 100° C. with stirring, while introducing a nitrogen gas thereinto. When the temperature became constant at 100° C., a mixed fluid of 54 g of methacrylic acid, 290 g of tert-butyl methacrylate, 200 g of n-butyl acrylate, 256 g of methyl methacrylate, 200 g of ethyl acrylate and 10 g of azobisisobutyronitrile was added dropwise to the flask in 3 hours, followed by stirring at 100° C. for 3 hours. Then, a solution obtained by dissolving 3 g of azobisdimethylvaleronitrile in 100 g of propylene glycol monopropyl ether was added dropwise to the flask in 10 minutes, followed by stirring at 100° C. for 4 hours.

The thus obtained copolymer (a-4) had a weight average molecular weight of 31,000 and an acid number of 36.1.

The solid content of the copolymer solution was 45.1% by weight.

EXAMPLE 1

To 221 g of the copolymer (A-1) solution, 1 g of 2-(p-methoxyphenyl)-4,6-bis(trichloromethyl)-s-triazine was added, followed by addition of 9.5 g of triethylamine for neutralization. Then, 780 g of deionized water was added dropwise gradually to the resulting fluid with stirring to give an electro-deposition bath (pH 7.9).

EXAMPLE 2

To 222 g of the copolymer (A-2) solution, 2 g of 2-(p-methoxystyryl)-4,6-bis(trichloromethyl)-s-triazine was added, followed by addition of 8.2 g of triethylamine for neutralization. Then, 780 g of deionized water was added dropwise gradually to the resulting fluid with stirring to give an electro-deposition bath (pH 8.4).

EXAMPLE 3

To 221 g of the copolymer (A-3) solution, 2 g of p-nitrobenzyl derivative of the formula (I) wherein R is an ethyl group and 50 g of dioxane were added and dissolved, followed by addition of 12 g of triethylamine for neutralization. Then, 730 g of deionized water was added dropwise gradually to the resulting fluid with stirring to give an electrodeposition bath (pH 7.2).

EXAMPLE 4

To 222 g of the copolymer (A-4) solution, 4 g of nitrobenzyl derivative of the formula (I) wherein R is a butyl group and 50 g of dioxane were added, followed by addition of 6.5 g of triethylamine for neutralization. Then, 780 g of deionized water was added dropwise gradually to the resulting fluid with stirring to give an electrodeposition bath (pH 8.9).

Comparative Example 1

A copolymer was synthesized under the same conditions as (A-1) except for using the same amount of methyl methacrylate in place of n-butyl acrylate (the component (c)) in the monomer composition of (A-1). The resulting copolymer had a weight average molecular weight of 46,000 and an acid number of 65. The solid content of the copolymer solution was 45.3% by weight.

Using the resulting copolymer solution, an electrodeposition bath was prepared in the same manner as described in Example 1.

In each electrodeposition bath obtained in Examples 1 to 4 and Comparative Example 1 (water dispersion stability of each electrodeposition bath being shown in Table 1), a substrate of copper-clad glass epoxy laminate (MCL-E-62, a trade name, mfd. by Hitachi Chemical Company, Ltd.) as an anode and a stainless steel plate (SUS 304, a size of 200 mm × 75 mm × 1 mm) as a cathode were dipped A direct current of 150 V was applied for 3 minutes at 25° C. to form an electrodeposited film on the surface of copper-clad laminate, which was washed with water, drained and dried at 80° C. for 15 minutes (the film thickness after dried and surface appearance of coated film being shown in Table 1).

Then, the resulting film was exposed to light via a photomask with a dose of 800 mJ/cm$^2$ from a 3 kW ultrahigh pressure mercury lamp, followed by heating at 130° C. for 10 minutes. After cooling the substrate, development was carried out by spraying an aqueous solution of 1% sodium carbonate (spraying pressure: 1.0 kg/cm$^2$). The photosensitivity and the resolution are shown in Table 1.

As is clear from Table 1, the water dispersion stability of each electrodeposition bath of the present invention is remarkably good. Further, the photo-sensitivity of resist is high, so that a good resist pattern with high resolution is formed.

On the other hand, the electrodeposition bath of Comparative Example 1 is worse in the water dispersion stability compared with Examples 1 to 4. Further, the film thickness obtained under the same electrodeposition conditions as Examples 1 to 4 is thinner than those of Examples 1 to 4. Electrodeposition properties such as surface appearance of coated film are remarkably poor. As to photosensitive properties, the photosensitivity of Comparative Example 1 has a tendency to lower. In addition, the resolution is low probably due to poor surface state of the film.

TABLE 1

| | Water dispersion stability of electrodeposition bath *1 (days) | Electrodeposited film (Photosensitive film) | | Photosensitive properties of resist | |
| --- | --- | --- | --- | --- | --- |
| | | Film thickness (μm) | Appearance of coated film | Photosensitivity (steps) *2 | Resolution (μm) |
| Example 1 | >45 | 8 | Good | 3 | ≦30 |

TABLE 1-continued

| | Water dispersion stability of electrodeposition bath *1 (days) | Electrodeposited film (Photosensitive film) | | Photosensitive properties of resist | |
|---|---|---|---|---|---|
| | | Film thickness (μm) | Appearance of coated film | Photosensitivity (steps) *2 | Resolution (μm) |
| Example 2 | >45 | 8 | Good | 3 | ≦30 |
| Example 3 | >45 | 10 | Good | 5 | ≦30 |
| Example 4 | >45 | 8 | Good | 6 | ≦30 |
| Comparative Example 1 | ≦30 | 2 | Poor (Rough surface) | 2 | ≧200 |

Note)
*1: Water dispersion stability was evaluated by the number of days to generate a precipitate from the initial time of electrodeposition bath while allowing to stand.
*2: Photosensitivity was evaluated by step tablets (using photomasks having an optical density of 0.05 at a first step, and an increasing optical density of 0.15 per step)

Reference Example 2 copolymers (A-5) to (A-8) were prepared as follows.
(A-5)
The process of (A-1) in Reference Example 1 was repeated except for using the following mixed fluid:

| methacrylic acid | 100 g |
|---|---|
| tert-amyl methacrylate | 650 g |
| n-butyl acrylate | 250 g |
| azobisisobutyronitrile | 10 g |

The thus obtained copolymer (A-5) had a weight average molecular weight of 38,000 and an acid number of 65.2.
The solid content of the copolymer solution was 45.1% by weight. (A-6)
The process of (A-2) in Reference Example 1 was repeated except for using the following mixed fluid:

| methacrylic acid | 77 g |
|---|---|
| tert-amyl methacrylate | 310 g |
| 2-ethylhexyl acrylate | 450 g |
| methyl methacrylate | 163 g |
| azobisisobutyronitrile | 7 g |

The thus obtained copolymer (A-6) had a weight average molecular weight of 45,000 and an acid number of 50.2.
the solid content of the copolymer solution was 45.3% by weight. (A-7)
The process of (A-3) in Reference Example 1 was repeated except for using the following mixed fluid:

| acrylic acid | 141 g |
|---|---|
| tert-amyl methacrylate | 500 g |
| 2-ethylhexyl acrylate | 359 g |
| azobisisobutyronitrile | 10 g |

The thus obtained copolymer (A-7) had a weight average molecular weight of 51,000 and an acid number of 111.1.
The solid content of the copolymer solution was 45.1% by weight. (A-8)
The process of (A-4) in Reference Example 1 was repeated except for using the following mixed fluid:

| acrylic acid | 54 g |
|---|---|
| tert-amyl methacrylate | 250 g |
| n-butyl acrylate | 200 g |
| methyl methacrylate | 296 g |
| ethyl acrylate | 200 g |
| azobisisobutyronitrile | 10 g |

The thus obtained copolymer (A-8) had a weight average molecular weight of 27,000 and an acid number of 37.2.
The solid content of the copolymer solution was 45.5% by weight.

EXAMPLE 5

To 222 g of the copolymer (A-5) solution, 1 g of 2-(p-methoxyphenyl)-4,6-bis(trichloromethyl)-s-triazine and 3 g of a p-nitrobenzyl derivative of the formula (I) wherein R is a propyl group were added, followed by addition of 9.5 g of triethylamine for neutralization. Then, 780 g of deionized water was added dropwise gradually to the resulting fluid with stirring to give an electrodeposition bath (pH 7.9).

EXAMPLE 6

To 221 g of the copolymer (A-6) solution, 2 g of 2-(p-methoxystyryl)-4,6-bis(trichloromethyl)-s-triazine and 1 g of a p-nitrobenzyl derivative of the formula (I) wherein R is an ethyl group were added, followed by addition of 8.2 g of triethylamine for neutralization. Then, 780 g of deionized water was added dropwise gradually with stirring to the resulting fluid to give an electrodeposition bath (pH 8.4).

EXAMPLE 7

To 222 g of the copolymer (A-7) solution, 2 g of a p-nitrobenzyl derivative of the formula (I) wherein R is an ethyl group and 50 g of dioxane were added and dissolved, followed by addition of 12 g of triethylamine for neutralization. Then, 730 g of deionized water was added dropwise gradually with stirring to give an electrodeposition bath (pH 7.3).

EXAMPLE 8

To 220 g of the copolymer (A-8) solution, 4 g of a p-nitrobenzyl derivative of the formula (I) wherein R is a butyl group and 50 g of dioxane were added, followed by addition of 6.5 g of triethylamine for neutralization. Then, 780 g of deionized water was added dropwise gradually with stirring to give an electrodeposition bath (pH 8.8).

Comparative Example 2

A copolymer was synthesized under the same conditions as (A-5) except for using the same amount of methyl methacrylate in place of n-butyl acrylate (the component (c)) in the monomer composition of (A-5).

The resulting copolymer had a weight average molecular weight of 37,000 and an acid number of 65. The solid content of the copolymer solution was 45.4% by weight.

Using the resulting copolymer solution, an electrodeposition bath was prepared in the same manner as described in Example 5.

In each electrodeposition bath obtained in Examples 5 to 8 and Comparative Example 2 (water dispersion stability of each electrodeposition bath being shown in Table 2), a substrate of copper-clad glass epoxy laminate (MCL-E-61, a trade name, mfd. by Hitachi Chemical Company, Ltd.) as an anode and a stainless steel plate (SUS 304, a size of 200 mm × 75 mm × 1 mm) as a cathode were dipped. A direct current of 150 V was applied for 3 minutes at 25° C. to form an electrodeposited film on the surface of copper-clad laminate, which was washed with water, drained and dried at 80° C. for 15 minutes (the film thickness after dried and surface appearance of the obtained film being shown in Table 2).

Then, the resulting film was exposed to light via a photomask with a dose of 800 mJ/cm² from a 3 kW ultrahigh pressure mercury lamp, followed by heating at 130° C. for 10 minutes. After cooling the substrate, development was carried out by spraying an aqueous solution of 1% sodium carbonate (spraying pressure: 1.0 kg/cm²). The photosensitivity and the resolution are shown in Table 2.

As is clear from Table 2, the water dispersion stability of each electrodeposition bath of the present invention is remarkably good. Further, the photosensitivity of resist is high, so that a good resist pattern with high resolution is formed.

On the other hand, the electrodeposition bath of Comparative Example 2 is worse in the water dispersion stability compared with Examples 5 to 8. Further, the film thickness obtained under the same electrodeposition conditions as Examples 5 to 8 is thinner than those of Examples 5 to 8. Electrodeposition properties such as surface appearance of coated film are remarkably poor. As to photosensitive properties, the photosensitivity of Comparative Example 2 has a tendency to lower. In addition, the resolution is low probably due to poor surface state of the film.

| | n-butyl acrylate | 250 g |
|---|---|---|
| | azobisisobutyronitrile | 10 g |

The thus obtained copolymer (A-9) had a weight average molecular weight of 36,000 and an acid number of 65.0.

The solid content of the copolymer solution was 45.1% by weight. (A-10)

The process of (A-2) in Reference Example 1 was repeated except for using the following mixed fluid:

| methacrylic acid | 77 g |
|---|---|
| isobornyl methacrylate | 310 g |
| 2-ethylhexyl acrylate | 450 g |
| methyl methacrylate | 163 g |
| azobisisobutyronitrile | 7 g |

The thus obtained copolymer (A-10) had a weight average molecular weight of 44,000 and an acid number of 50.6.

The solid content of the copolymer solution was 45.0% by weight. (A-11)

The process of (A-3) in Reference Example 1 was repeated except for using the following mixed fluid:

| acrylic acid | 141 g |
|---|---|
| isobornyl acrylate | 500 g |
| 2-ethylhexyl acrylate | 359 g |
| azobisisobutyronitrile | 10 g |

The thus obtained copolymer (A-11) had a weight average molecular weight of 50,000 and an acid number of 111.4.

The solid content of the copolymer solution was 44.6% by weight. (A-12)

The process of (A-4) in Reference Example 1 was repeated except for using the following mixed fluid:

| methacrylic acid | 54 g |
|---|---|
| isobornyl methacrylate | 250 g |
| n-butyl acrylate | 200 g |
| methyl methacrylate | 296 g |
| ethyl acrylate | 200 g |

TABLE 2

| | Water dispersion stability of electrodeposition bath (days) | Electrodeposited film (Photosensitive film) | | Photosensitive properties of resist | |
|---|---|---|---|---|---|
| | | Film thickness (μm) | Appearance of coated film | Photosensitivity (steps) | Resolution (μm) |
| Example 5 | >45 | 9 | Good | 6 | ≦30 |
| Example 6 | >45 | 10 | Good | 4 | ≦30 |
| Example 7 | >45 | 11 | Good | 6 | ≦30 |
| Example 8 | >45 | 9 | Good | 8 | ≦30 |
| Comparative Example 2 | ≦30 | 3 | Poor (Rough surface) | 3 | ≧200 |

Note)
See Table 1.

Reference Example 3

Copolymers (A-9) to (A-12) were prepared as follows. (A-9)

The process of (A-1) in Reference Example 1 was repeated except for using the following mixed fluid:

| methacrylic acid | 100 g |
|---|---|
| isobornyl acrylate | 650 g |

| azobisisobutyronitrile | 10 g |
|---|---|

The thus obtained copolymer (A-12) had a weight average molecular weight of 25,000 and an acid number of 37.7.

The solid content of the copolymer solution was 45.2% by weight.

EXAMPLE 9

To 223 g of the copolymer (A-9) solution, 1 g of 2-(p-methoxyphenyl)-4,6-bis(trichloromethyl)-s-triazine and 3 g of a p-nitrobenzyl derivative of the formula (I) wherein R is a propyl group were added, followed by addition of 9.4 g of triethylamine for neutralization. Then, 780 g of deionized water was added dropwise gradually to the resulting fluid with stirring to give an electrodeposition bath (pH 7.8).

EXAMPLE 10

To 222 g of copolymer (A-10) solution, 2 g of 2-(p-methoxstyryl)-4,6-bis(trichloromethyl)-s-triazne and 1 g of a p-nitrobenzyl detrivative of the formula (I) wherein R is an ethyl group were added, followed by addition of 8.3 g of triethylamine for neutralization. Then, 780 g of deionized water was added dropwise gradually with stirring to the resulting fluid to give an electrodeposition bath (pH 8.3).

EXAMPLE 11

To 224 g of copolymer (A-11) solution, 2 g of a p-nitrobenzyl derivative of the formula (I) wherein R is an ethyl group and 50 g of dioxane were added and dissolved, followed by addition of 12 g of triethylamine for neutralization. Then, 730 g of deionized water was added dropwise gradually with stirring to give an electrodeposition bath (pH 7.2).

EXAMPLE 12

To 221 g of the copolymer (A-12) solution, 4 g of a p-nitrobenzyl derivative of the formula (I) wherein R is a butyl group and 50 g of dioxane were added, followed by addition of 6.6 g of triethylamine for neutralization. Then, 780 g of deionized water was added dropwise gradually with stirring to give an electrodeposition bath (pH 8.9).

Comparative Example 3

A copolymer was synthesized under the same conditions as (A-9) except for using the same amount of methyl acrylate in place of n-butyl acrylate (the component (c)) in the monomer composition of (A-9). The resulting copolymer had a weight average molecular weight of 37,000 and an acid number of 65. The solid content of the copolymer solution was 45.4% by weight.

Using the resulting copolymer solution, an electrodeposition bath was prepared in the same manner as described in Example 9.

Each electrodeposition bath obtained in Examples 9 to 12 and Comparative Example 3 was subjected to evaluation of the water dispersion stability by observing days to generate a precipitate from the initial time of electrodeposition bath while allowing to stand. The results are shown in Table 3.

In each electrodeposition bath obtained in Examples 9 to 12 and Comparative Example 3, a substrate of copper-clad glass epoxy laminate (MCL-E-61, a trade name, mfd. by Hitachi Chemical Company, Ltd.) as an anode and a stainless steel plate (SUS 304, a size of 200 mm × 75 mm × 1 mm) as a cathode were dipped. A direct current of 150 V was applied for 3 minutes at 25° C. to form an electrodeposited film on the surface of copper-clad laminate, which was washed with water, drained and dried at 80° C. for 15 minutes (the film thickness after dried and surface appearance of the obtained film being shown in Table 3).

Then, the resulting film was exposed to light via a photomask with a dose of 800 mJ/cm$^2$ from a 3 kV ultrahigh pressure mercury lamp, followed by heating at 140° C. for 10 minutes. After cooling the substrate, development was carried out by spraying an aqueous solution of 1% by weight sodium carbonate (spraying pressure: 1.0 kg/cm$^2$). The photosensitivity and the resolution were measured and shown in Table 3. The photosensitivity was evaluated by step tablets using photomasks having an optical density of 0.05 at a first step and an increasing optical density of 0.15 per each step.

As is clear from Table 3, the water dispersion stability of each electrodeposition bath of the present invention is remarkably good. Further, the photosensitivity of resist is high, so that a good resist pattern with high resolution is formed.

On the other hand, the electrodeposition bath of Comparative Example 3 is worse in the water dispersion stability compared with Examples 9 to 12. Further, the film thickness obtained under the same electrodeposition conditions as Examples 9 to 12 is thinner than those of Examples 9 to 12. Electrodeposition properties such as surface appearance of coated film are remarkably poor. As to photosensitive properties, the photosensitivity of Comparative Example 3 has a tendency to lower. In addition, the resolution is low probably due to poor surface state of the film.

TABLE 3

|  | Water dispersion stability of electrodeposition bath (days) | Electrodeposited film (Photosensitive film) | | Photosensitive properties of resist | |
|---|---|---|---|---|---|
|  |  | Film thickness ($\mu$m) | Appearance of coated film | Photosensitivity (steps) | Resolution ($\mu$m) |
| Example 9 | >45 | 9 | Good | 6 | ≦30 |
| Example 10 | >45 | 10 | Good | 4 | ≦30 |
| Example 11 | >45 | 11 | Good | 6 | ≦30 |
| Example 12 | >45 | 9 | Good | 8 | ≦30 |
| Comparative Example 3 | ≦30 | 3 | Poor (Rough surface) | 8 | ≧200 |

Comparative Example 4

A copolymer was synthesized under the same conditions as (A-8) except for using the same amount of methyl methacrylate in place of n-butyl acrylate (the component (c)) in the monomer composition of (A-8). The resulting copolymer (P-2) had a weight average molecular weight of 29,000 and an acid number of 40.3. The solid content of the copolymer solution was 45.4% by weight. Using the resulting copolymer solution, an electro-deposition bath was prepared in the same manner as described in Example 8.

Comparative Example 5

A copolymer was synthesized under the same conditions as (A-1) except for using the same amount of methyl methacrylate in place of tert-butyl methacrylate (the component (b)) in the monomer composition of (A-1). The resulting copolymer (P-3) had a weight average molecular weight of 38,000 and an acid number of 64.9. The solid content of the copolymer solution was 45.5% by weight. Using the resulting copolymer solution, an electrodeposition bath was prepared in the same manner as described in Example 1.

Comparative Example 6

Using the copolymer solution (P-3) in place of copolymer solution (A-1) and the same amount of 1,2-naphthoquinonediazido-5-sulfonate ester of 2,3,4-trihydroxybenzophenone in place of 2-(p-methoxyphenyl)-4,6-bis(trichloromethyl)-s-triazine (the component (B)), an electrodeposition bath was prepared in the same manner a described in Example 1.

As mentioned above, the water dispersion stability of each electrodeposition bath of present invention is remarkably good. Furhter, the photosensitivity of resist is high, so that a good resist pattern with high resolution is formed, which shows that the present invention is good for producing higher density printed circuit boards without causing cutting of circuits or short-circuit.

On the other hand, the electrodeposition bath of Comparative Examples 1 and 2 using the copolymer synthesized with methyl methacrylate capable of forming a homopolymer having a glass transition temperature of 100° C. or higher in place of the component (c) are worse in the water dispersion stability compared with Examples 1 to 12. Further, the film thickness obtained under the same electrodeposition conditions as Examples 1 to 12 is thinner than those of Examples 1 to 12, and surface appearance of coated film is worse, so that electro-deposition properties are remarkably poor. As to photosensitive properties, the photosensitivity of Comparative Examples 4 has a tendency to lower. In addition, the resolution is low probably due to poor surface state of film.

In case of Comparative Example 5 using the copolymer synthesized with methyl methacrylate which has no unstable group against an acid in place of the component (b), electrodeposition properties are the same as Examples 1 to 12, but the exposure part cannot be developed, resulting in showing no photosensitivity.

In case of Comparative Example 6 using 1,2-naphthoquinonediazido-5-sulfonate ester of 2,3,4-trihydroxybenzophenone in place of the component (B), further, the film thickness obtained under the same electrodeposition conditions as Examples 1 to 12 is smaller than those of Examples 1 to 12, and surface appearance of coated film is worse, so that electro-deposition properties are remarkably poor, and the stability of the electrodeposition bath is worse. As to photosensitive properties, Comparative Example 6 has a tendency to lower the photosensitivity. In addition, the resolution is low probably due to poor surface state of film.

As is clear from these results, various improvements of properties shown in Examples 1 to 12 are obtained by using the positive type photosensitive anionic electrodeposition coating resin composition comprising a copolymer (A) obtained from particularly a compound having an unstable group against an acid and a photoacid generator (B).

As mentioned above, the water dispersion stability of electrodeposition baths using the positive type photosensitive anionic electrodeposition coating resin compositions of the present invention is remarkably high. Further, electrodeposited films (photosensitive films) obtained by electrodeposition using such electrodeposition baths are remarkably excellent in photosensitivity and high in the resolution to form a resist pattern with desirable good shape.

The resulting resist pattern can be used as a relief. Further, by forming a resist pattern using a copper-clad laminate as a substrate and conducting etching or plating, or the like, a printed circuit board with remarkably high in precision and density can be produced.

What is claimed is:

1. A resin composition for forming an electrodeposition bath, said composition comprising (A) a copolymer obtained by copolymerizing as essential components
   (a) at least one member selected from the group consisting of acrylic acid and methacrylic acid,
   (b) at least one compound having an unstable group against an acid, and
   (c) a polymerizable monomer capable of forming a homopolymer having a glass transition temperature of 0° C. or lower; said copolymer having an acid number of 20 to 230 and being neutralized with a base, and (B) a compound capable of generating an acid when exposed to actinic light.

2. A composition according to claim 1, wherein the component (b) is at least one member selected from the group consisting of t-butyl methacrylate, t-butyl acrylate, t-amyl methacrylate, t-amyl acrylate, isobornyl methacrylate and isobornyl acrylate.

3. A composition according to claim 1, wherein the component (b) is at least one member selected from the group consisting of t-butyl methacrylate and t-butyl acrylate.

4. A composition according to claim 1, wherein the component (b) is at least one member selected from the group consisting of t-amyl methacrylate and t-amyl acrylate.

5. A composition according to claim 1, wherein the component (b) is at least one member selected from the group consisting of isobornyl methacrylate and isobornyl acrylate.

6. A composition according to claim 1, wherein the component (c) is at least one member selected from the group consisting of n-butyl acrylate and 2-ethylhexyl acrylate.

7. A composition according to claim 1, wherein the component (B) is a compound of the formula:

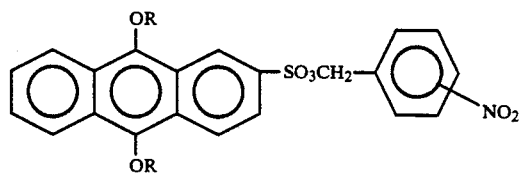

wherein R is an alkyl group.

8. An electrodeposition bath comprising the composition of claim 7.

9. A composition according to claim 1, further comprising (C) a hydrophilic organic solvent.

10. A composition according to claim 9, wherein said hydrophilic organic solvent is a solvent selected from the group consisting of dioxane, methoxyethanol, ethoxyethanol, diethyleneglycol and a mixture thereof.

11. A composition according to claim 1, wherein the content of copolymer (A) is in an amount of 60 to 99.999 parts by weight per 100 parts by weight of the total weight of copolymer (A) and compound (B).

12. A composition according to claim 11, wherein in the copolymer (A), component (a) is in an amount of 2 to 35 parts by weight, component (b) is in an amount of 10 to 80 parts by weight and component (c) is in an amount of 5 to 75 parts by weight per 100 parts by weight of the total of monomers constituting the copolymer (A).

* * * * *